United States Patent [19]

Shidara et al.

[11] 4,330,733
[45] May 18, 1982

[54] PHOTOCONDUCTIVE TARGET

[75] Inventors: Keiichi Shidara, Tama; Naohiro Goto, Machida; Tatsuro Kawamura, Tama; Eikyu Hiruma, Komae; Yohitsumu Ikeda; Kenkichi Tanioka, both of Tokyo; Tadaaki Hirai, Koganei; Yukio Takasaki, Hachioji; Chushirou Kusano, Hachioji; Tsuyoshi Uda, Hachioji; Yasuhiko Nonaka, Mobara, all of Japan

[73] Assignees: Nippon Hoso Kyokai; Hitachi, Ltd., both of Tokyo, Japan

[21] Appl. No.: 152,291

[22] Filed: May 22, 1980

[30] Foreign Application Priority Data

Jun. 7, 1979 [JP] Japan .................................. 54-71767

[51] Int. Cl.³ ........................ H01J 29/45; H01J 31/38
[52] U.S. Cl. ..................................... 313/386; 313/94
[58] Field of Search ................. 313/94, 384, 385, 386, 313/388

[56] References Cited

U.S. PATENT DOCUMENTS 3,890,525 6/1975 Hirai et al. ........................... 313/386
3,984,722 10/1976 Maruyama et al. .................. 313/386
4,040,985 8/1977 Shidara et al. ....................... 313/385

Primary Examiner—Eli Lieberman
Attorney, Agent, or Firm—Craig and Antonelli

[57] ABSTRACT

A photoconductive target having an electrode and a P-type conductive layer mainly made of Se and making rectifying contact at an interface with the electrode, with at least Te being doped in a portion of the P-type conductive layer. At least one metal fluoride forming shallow levels is doped in the region where the signal current is generated for the most part of the P-type conductive layer with an average concentration of not less than 50 ppm and not more than 5% by weight. The metal fluoride is preferably at least one selected from the group consisting of LiF, NaF, $MgF_2$, $CaF_2$, $BaF_2$, $AlF_3$, $CrF_3$, $MnF_2$, $CoF_2$, $PbF_2$, $CeF_3$ and TlF. The high light sticking of the photoconductive target can thus be considerably reduced.

5 Claims, 6 Drawing Figures

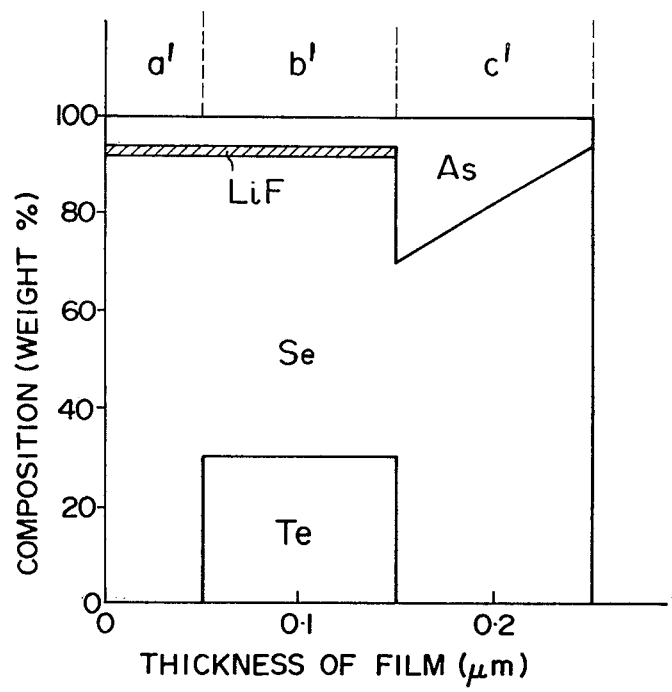
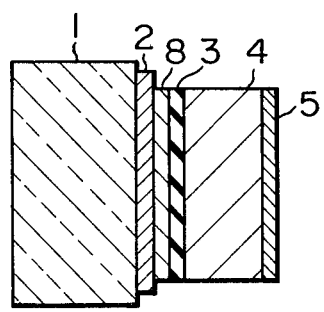
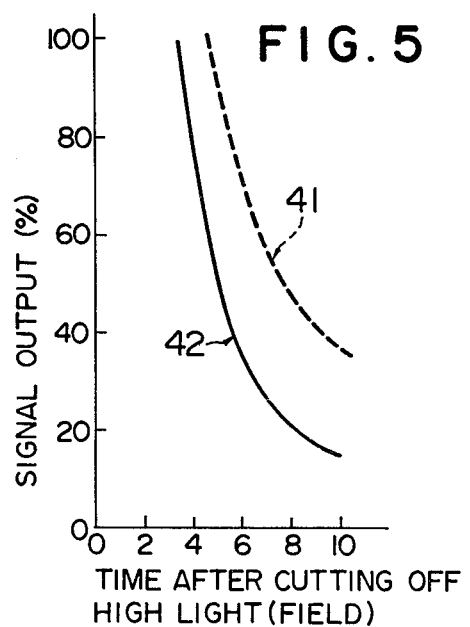

PHOTOCONDUCTIVE TARGET

The present invention relates to a structure of a photoconductive layer of a target used in an image pickup tube, and particularly it relates to a structure which improves photoresponses of a rectifying contact type photoconductive layer, among others photoresponse when an intense incident light is cut off.

As is known in the art, amorphous selenium (Se) has photoconductivity and when it is combined with a signal electrode of "N" conductivity type a photodiode type photoconductive target is provided. Since Se is not sensitive to long-wave radiation, it has been proposed to add Te into a portion of the Se-containing layer in order to improve the sensitivity to long-wave radiation. This method is disclosed in Japanese Published Unexamined Patent Application No. 49-24619 (corresponding to U.S. Pat. No. 3,890,525) and U.S. Pat. No. 4,040,985.

FIG. 1 shows a basic structure of a typical target of the prior art, such as that disclosed in the U.S. Pat. No. 4,040,985. In FIG. 1, numeral 1 designates a transparent faceplate, numeral 2 designates a transparent N-type conductive layer, and numeral 3 designates the first P-type photoconductive layer which corresponds to a sensitized portion of a P-type photoconductive film. Numeral 4 denotes the second P-type conductive layer which serves to reduce a storage capacitance of the target and numeral 5 denotes a layer for assisting the landing of scanning electron beam. The layer 3 may be made of Se, As and Te, the layer 4 may be made of Se and As, and the layer 5 may be made of $Sb_2S_3$. Element As is added into the layers 3 and 4 to enhance the thermal stability of Se. Numeral 6 denotes an incident light and numeral 7 denotes a scanning electron beam.

FIG. 2 shows an example of constituent distribution in the direction of thickness from the signal electrode side of the P-type photoconductor sensitized layer 3 shown in FIG. 1. In the illustrated example, sensitizing Te does not exist at zero level of the film thickness (region a) corresponding to the interface with the transparent conductive layer 2, and the concentration of Te rapidly increases from a 1000 Å level of the film thickness and Te is added over the thickness of 1500 Å (region b). The element As is added in the regions a and b to enhance the thermal stability of Se. Region c is added with As which is considered to form deep levels in the energy gap to enhance the effect of sensitization. The concentration of As decreases at a uniform rate over the film thickness of 2500 Å. This As also serves to enhance the thermal stability of Se. The target which has the structure of this type attains an object for increasing sensitivity to long-wave radiation.

The image pickup tube of this type exhibits good characteristics to the ordinary requirements for image pickup tubes such as lag and after-image. Apart from the above, it has been proposed to dope a small amount of halogen in order to improve the lag and the after-image of the target used in a pickup tube whose main component is Se and which utilizes rectifying contact. This method is disclosed in Japanese Pat. No. 919,862 (corresponding to U.S. Pat. No. 3,984,722). The target of this type exhibits good characteristics in ordinary usage condition, but if the intensity of incident light becomes considerably higher than normal usage condition, the response after the incident light has been cut off (lag for intense light) gets deteriorated. The longer the operating time becomes, the more deteriorated that response is. The normal usage condition used herein is determined as the condition in which the intensity of the incident light is such that it produces a signal current output of approximately 0.2 $\mu A$ P—P. And the intensity of the light used herein is roughly 20 times as high as that of the normal usage condition, although the value is not defined critically. The lag resulting from such an intense light is usually referred to as "high light sticking."

The object of the present invention is to improve a target used in a pickup tube made of Se-based amorphous material so as to minimize the high light sticking.

In order to attain the above object, the photoconductive target of the present invention has the following structure.

In the photoconductive target which is sensitized by adding Te partially into a P-type amorphous photoconductive layer whose main component is Se and which has a rectifying contact at the interface with the signal electrode, at least one kind of metal fluorides is doped with concentration of not less than 50 ppm and not more than 5% by weight or an average into the region where the signal current is generated for the most part. The metal fluorides to be doped may be selected from a group consisting of LiF, NaF, $MgF_2$, $CaF_2$, $BaF_2$, $AlF_3$, $CrF_3$, $MnF_2$, $CoF_2$, $PbF_2$, $CeF_3$ and TlF.

The present invention will now be explained in conjunction with the accompanying drawings, in which:

FIG. 3 shows a constituent distribution of a major portion of a target of the present invention;

FIG. 4 shows a sectional view of another target used in an image pickup tube;

FIG. 5 illustrates high light sticking; and

Figure 1:
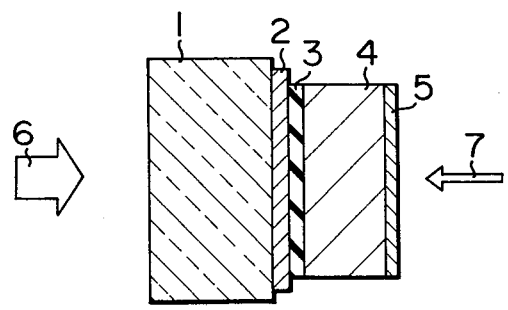
FIG. 1 shows a sectional view of a target used in a pickup tube.

FIG. 3 shows a basic structure for explaining the present invention and it shows an improved constituent distribution of the portion corresponding to the layer 3 shown in FIG. 1. The constitution percentages in the following description are given by weight percent. The portion corresponding to the layer 3 of FIG. 1 is an amorphous photoconductive layer, of which the main component is Se, and into which Te is added locally for sensitization. The regions a' and b' in FIG. 3 are photosensitive layer for absorbing major portion of light impinged on the target and generating signal current carriers.

In the instance of FIG. 3, Te does not exist at zero level of the film thickness corresponding to the interface with the transparent conductive layer (region a'), and the concentration of Te rapidly increases from 500 Å level of the film thickness. That is, Te is added with concentration of 30% from 500 Å level to 1500 Å of the film thickness (region b'). Element As is doped in the regions a' and b' with uniform concentration of 6% in the direction of thickness, and it has decreasing concentration gradient in the region c'. The concentration in the region c', of which the thickness is 1000 Å, is 30% at the starting point and 6% at the end point. The concentration of Te and As is, in principle, the same as that of FIG. 2. The P-type conductive layer of this type typically comprises the first P-type conductive layer having a photosensitive layer and the second P-type conductive layer. A typical example of the first P-type conductive layer 3 of FIG. 1 comprises, in the sequence as viewed from the transparent electrode, the first region a' in FIG. 3 mainly made of Se having a thickness greater than 100 Å, to which at least one member selected from the group consistinng of Te and additive elements capable of forming a deep level in Se is added, the quantities of Te and the additive elements being, respectively, of a concentration not more than 15 atomic % in an average; the second region b' in FIG. 3 mainly made of Se having a thickness ranging between 200 Å and 5,000 Å in which the peak of continuous distribution of the concentration of the added Te is not less than 15 atomic %; and the third region c' in FIG. 3 mainly made of Se having a thickness ranging between 500 Å and 3,000 Å in which the additive element capable of forming deep levels in Se has a peak of the continuous distribution of concentration of not less than 20 atomic %. At least one element capable of forming the deep levels in Se is selected from the group consisting of As, Sb, Bi, Ge and a mixture thereof.

Figure 2:
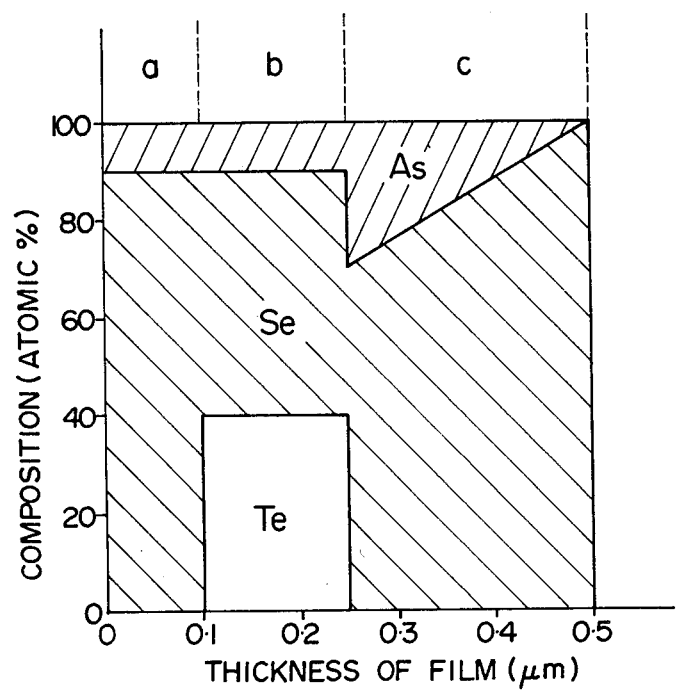
FIG. 2 shows a constituent distribution at a major portion of a target of prior art.

The photoconductive film of the present invention differs from that shown in FIG. 2, in that LiF is uniformly distributed in the direction of thickness with concentration of 4,000 ppm in the regions a' and b', that is, the photosensitive layer. In the illustrated example, LiF distributes with uniform concentration in the direction of thickness, but it is not necessarily uniform but may have different concentrations in the regions a' and b', or it may have concentration gradient in each of these regions. Alternatively, fluoride may be doped only in the region a' or region b' to attain a similar effect, or the metal fluoride may even be dopd at a portion of the photosensitive layer. The essential point is to dope LiF in the carrier generating portion (photosensitive layer). In the illustrated example, Te concentration distributes in rectangular shape but this shape is not always necessary and it may be triangle, trapezoid or more complex shape.

In a specific example of construction, at least one member of the metal fluorides mentioned above is doped with average concentration of not less than 50 ppm and not greater than 5% by weight into the Te-free portion of the region where the signal current is generated for the most part, and at least one member of the metal fluorides mentioned above is doped with average concentration of not less than 100 ppm and not greater than 10% by weight into at least a portion of the Te-containing region. It is important in this case that the average weight percent of the metal fluoride in the region where the signal current is generated for the most part, is within the range mentioned above.

The present invention is not limited to the typical embodiment described above and its modification, but it may be applicable to the photosensitive layer comprising the amorphous photoconductive layer mainly made of Se having Te added therein. Other fluorides may be used with the fluorides mentioned above.

A blocking layer for the dark current typically made of an N-type oxide such as cerium oxide may be interposed between the signal electrode and the photosensitive layer. It should be understood that any blocking layer may be applied. In such a case, there is no essential difference in the operation of the target and it is still in the scope of the present invention.

The second P-type conductive layer 4 (FIG. 1) may be a conventional one. A typical example of the second P-type conductive layer is mainly made of Se to which at least one member selected from the group consisting of Te and additive elements capable of forming deep levels in Se is added, as the quantities of Te and the additive elements being selected to be not more than 15 atomic % in an average, respectively.

In the present specification, the photoconductive layer comprising the first and second P-type photoconductive layers is simply referred to as the P-type photoconductive layer.

The metal fluorides are effectively doped in the region where the signal current is generated for the most part (that is, the photosensitive layer). No effect will be attained when the metal fluorides are doped in the layer 4 of FIG. 1 although it is the same P-type conductive layer as the photosensitive layer. On the contrary, this will deteriorate the photoconductive characteristics of the image pickup tube.

Examples of the target structures in accordance with the present invention are explained below:

EXAMPLE 1

Referring to FIG. 4, a transparent conductive layer 2 mainly made of tin oxide is formed on a glass substrate 1 and $CeO_2$ is evaporated thereon in vacuum of $3 \times 10^{-6}$ Torr to a thickness of 300 Å to form an auxiliary rectifying contact layer 8. Then, Se and LiF are simultaneously evaporated thereon, from separate evaporation sources, to a thickness of 300 Å to form the first layer of the first P-type conductive layer 3. LiF is doped with uniform concentration of 4000 ppm in the direction of thickness. Then, Se, Te and LiF are simultaneously evaporated, from separate evaporation sources, to a thickness of 300 Å. The concentration of Te is 31% and that of LiF is 4000 ppm, and they distribute uniformly in the direction of thickness. Se and Te are further evaporated simultaneously from separate evaporation sources to a thickness of 300 Å. The concentration of Te is 31% and distributes uniformly in the direction of thickness. Those two layers constitute the second layer which, together with the first layer, constitutes the photosensitive layer. The third layer made of Se and As is evaporated on the second layer. In evaporating the third layer, Se and $As_2Se_3$ are simultaneously evaporated from separate evaporation sources. The $As_2Se_3$ boat current is controlled such that the concentration of As is 27% at the starting point and smoothly decreases as the evaporation proceeds until it reaches 0% at the end point of the third layer, that is, the 700 Å level. Then, Se is evaporated on the third layer to form the second P-type conductive layer 4, to such a thickness that a total thickness from the first layer of the first P-type conductive layer 3 to the second P-type conductive layer 4 is equal to 4 μm. The evaporation processes to the second P-type conductive layer 4 are carried out in the vacuum of $3 \times 10^{-6}$ Torr. Then, $Sb_2S_3$ layer 5 is evaporated on the second P-type conductive layer 4 in argon atmosphere of $2 \times 10^{-1}$ Torr to a thickness of 1000 Å. If desired, As is added with concentration of 3% over a region extending from the first layer to the 2nd P-type conductive layer 4 to enhance the thermal stability of the target.

While LiF is used as the metal fluoride in the above example, a similar effect is attained when other fluorides such as NaF, $MgF_2$, $CaF_2$, $BaF_2$, $AlF_3$, $CrF_3$, $MnF_2$, $CoF_2$, $PbF_2$, $CeF_3$ or TlF are used.

EXAMPLE 2

Referring to FIG. 1, a transparent conductive layer 2 mainly made of tin oxide is formed on a glass substrate 1, and Se, As₂Se₃ and CaF₂ are simultaneously evaporated thereon from separate evaporation sources to a thickness of 100–500 Å to form the first layer of the first P-type conductive layer 3. The As concentration is 6% and the CaF₂ concentration is 5000 ppm, and they distribute uniformly in the direction of thickness. Then, Se, As₂Se₃, Te and CaF₂ are simultaneously evaporated from separate evaporation sources to a thickness of 450–1000 Å to form the second layer. The concentrations of Te, As and CaF₂ are uniform in the direction of thickness and they are 20–35% for Te, 3–6% for As and 3,000–7,000 ppm for CaF₂. The third layer made of Se and As is evaporated on the second layer to a thickness of 500–1500 Å. In evaporating the third layer, Se and As₂Se₃ are simultaneously evaporated from separate evaporation sources. The As₂Se₃ boat current is controlled such that the As concentration is initially 20–30% and it smoothly decreases as the evaporation proceeds to finally reach 0–3% at the end of the third layer. Se and As₂Se₃ are then simultaneously deposited on the third layer to form the second P-type conductive layer 4 to such a thickness that a total thickness of the layer is equal to 6 μm. The concentration of As of the second P-type conductive layer 4 is 3%. The first P-type conductive layer 3 through the second P-type conductive layer 4 are evaporated in the vacuum of $2 \times 10^{-6}$ Torr. Then, Sb₂S₃ layer 5 is evaporated on the second P-type conductive layer 4 in argon atmosphere of $2 \times 10^{-1}$ Torr to a thickness of 1000 Å.

When LiF is doped in the region a' of the photoconductive layer 3 and CaF₂ is doped in the region b', or when these materials are doped vice versa, similar effect is obtainable. Furthermore, when LiF is doped in addition to CaF₂ at a ratio of 2/1, similar effect is obtainable. Total amount of dopants is 3,000–7,000 ppm. Similar effect is obtainable when other of the fluorides mentioned above is used.

EXAMPLE 3

Referring to FIG. 4, the transparent conductive layer 2 mainly made of tin oxide is formed on the glass substrate 1, and a GeO₂ layer and a CeO₂ layer are evaporated thereon in this order to a thickness of 150 Å, respectively, to form the auxiliary rectifying contact layer 8. The evaporation is carried out in the vacuum of $2 \times 10^{-6}$ Torr. Then, Se, As₂Se₃ and MgF₂ are simultaneously evaporated from separate evaporation sources to a thickness of 300 Å to form the first layer of the first P-type conductive layer 3. The As concentration is 3% and the MgF₂ concentration is 3,000 ppm, and they distribute uniformly in the direction of thickness. The second layer is evaporated on the first layer. This is carried out in two steps. First, Se, As₂Se₃, Te and MgF₂ are simultaneously evaporated from separate evaporation sources to a thickness of 200 Å to form the first half of the second layer. The concentration of As is 3% and the concentration of Te is 30%, and they distribute uniformly in the direction of thickness. The concentration of MgF₂ is controlled such that it is initially 8000 ppm and smoothly decreases as the evaporation proceeds until it finally reaches 0 ppm at the end of the 200 Å thick first half of the second layer. The concentration of MgF₂ is controlled by varying the evaporation boat current. Then, Se, As₂Se₃ and Te are evaporated to form the second half of the second layer. The evaporation process may be same as that for the first half layer. The concentration of As is 3% and the concentration of Te is 30%, and they distribute uniformly in the direction of thickness. The thickness of the second half layer is 200 Å. This completes the evaporation of the second layer. Then, Se and As are evaporated thereon to form the third layer. In evaporating the third layer, Se and As₂Se₃ are simultaneously evaporated from separete evaporation sources. The boat current for evaporating As₂Se₃ is controlled such that the concentration of As in initially 29% and it smoothly decreases as the evaporation proceeds until it reaches 3% at the end of the 600 Å thick third layer. Then, Se and As are evaporated on the third layer to form the second P-type conductive layer 4 to such a thickness that a total film thickness is equal to 4 μm. The concentration of As of the second P-type conductive layer 4 is 3% and it uniformly distributes in the direction of thickness. The first layer of the first P-type conductive layer 3 through the second P-type conductive layer 4 are evaporated in the vacuum of $2 \times 10^{-6}$ Torr. Then, Sb₂S₃ is evaporated on the second P-type conductive layer 4 in argon atmosphere of $2 \times 10^{-1}$ Torr to a thickness of 1000 Å.

According to the present invention, the response after the incident light is cut off in such a circumstance that the intensity of the incident light gets considerably higher than that of normal useage (that is, high light sticking) is improved, and the response is good even after the long time operation. While physical meaning of this effect has not been clarified, it is considered that the shallow levels, which readily capture the signal current carriers and readily release them after the radiation is ceased, are formed by the doping of impurities, and those levels act more effectively than the existing levels.

Figure 6:
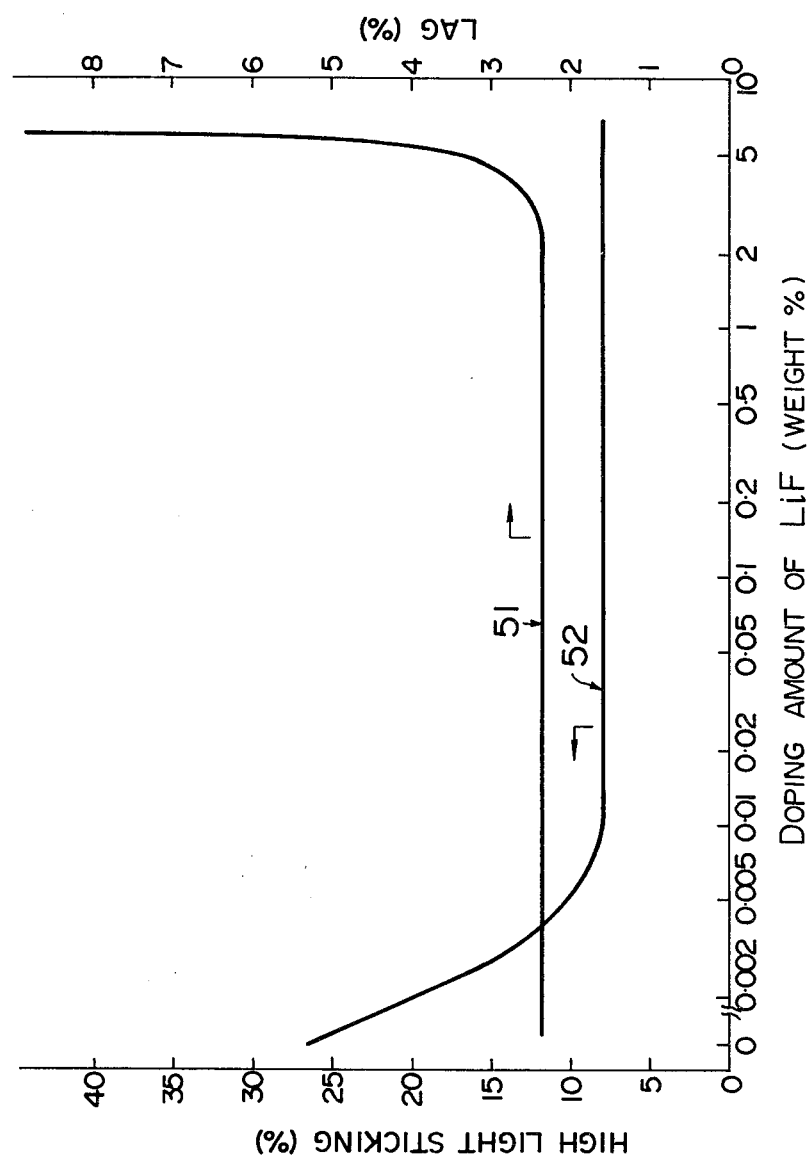
FIG. 6 shows the dependence of the lag and the high light sticking on the doping amount of LiF.

FIG. 5 shows lag characteristics for an intense light measured after two-hour operation. The incident light is 500 times as high as that of the normal usage condition. An abscissa represents the number of fields after the incident light has been cut off and an ordinate represents a ratio to a signal current (0.2 μA) of normal usage condition. A broken line 41 in FIG. 5 shows a characteristic of a conventional target, and it can be improved as shown by a solid line 42 in accordance with the present invention. Since the effect of the present invention is attained by the doping of fluorides, the effect is less when the amount of doped impurities is less. On the other hand, if the impurities are doped too much, the transport of the carriers is impeded and the lag characteristic is deteriorated. Preferable range of concentration is 50 ppm—5%, in an average, to the photosensitive layer, as shown in FIG. 6, in which an abscissa represents the concentration of LiF (average value in the photosensitive layer) and an ordinate represents lag and high light sticking. The lag (for signal current of 0.2 μA) is shown by a ratio of the magnitude at the third field after cutting off the incident light to the signal current of 0.2 μA, and the high light sticking (for signal current of 4 μA) is shown by a ratio of the magnitude at the tenth field after cutting off the incident light to the signal current of 0.2 μA. The curve 51 in FIG. 6 shows the dependence of the lag on the amount of doping of LiF, and the curve 52 shows the dependence of the high light sticking. The dependence of the lag and the high light sticking on the amount of dopant is equally applicable when other metal fluorides are used.

What is claimed is:
1. A photoconductive target having an electrode and a P-type conductive layer mainly made of Se and having rectifying contact at an interface with said electrode, a portion of said P-type conductive layer being added with at least Te, at least one metal fluoride forming shallow levels being doped in the region where the signal current is generated for the most part of said P-type conductive layer with an average concentration of not less than 50 ppm and not more than 5% by weight.

2. A photoconductive target according to claim 1, wherein said metal fluoride forming the shallow levels is at least one member selected from the group consisting of LiF, NaF, $MgF_2$, $CaF_2$, $AlF_3$, $CrF_3$, $MnF_2$, $CoF_2$, $PbF_2$, $BaF_2$, $CeF_3$ and TlF.

3. A photoconductive target according to claim 1 or 2, wherein at least one metal fluoride is doped in a Te-free portion of said region where the signal current is generated for the most part with an average concentration of not less than 50 ppm and not more than 5% by weight, and at least one metal fluoride is doped in a portion of the Te-containing region with an average concentration of not less than 100 ppm and not more than 10% by weight.

4. A photoconductive target according to claim 1 or 2, wherein said electrode is a transparent electrode formed on a transparent substrate, and a blocking layer is interposed between said electrode and said P-type conductive layer.

5. A photoconductive target according to claim 4, further having a beam landing layer on said P-type conductive layer.

* * * * *